(12) United States Patent
Slaight et al.

(10) Patent No.: US 6,907,377 B2
(45) Date of Patent: Jun. 14, 2005

(54) METHOD AND APPARATUS FOR INTERCONNECT BUILT-IN SELF TEST BASED SYSTEM MANAGEMENT PERFORMANCE TUNING

(75) Inventors: Thomas M. Slaight, Beaverton, OR (US); Jay J. Nejedio, Wilsonville, OR (US); Russell L. Carr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 10/404,476

(22) Filed: Mar. 31, 2003

(65) Prior Publication Data

US 2004/0204879 A1 Oct. 14, 2004

(51) Int. Cl.[7] ............................................. G06F 19/00
(52) U.S. Cl. .................... 702/117; 702/122; 702/123; 702/182; 702/189; 714/733; 714/726; 324/73.1; 324/763; 370/241
(58) Field of Search ................................ 702/117, 122, 702/123, 182, 186, 189; 714/733, 726; 324/73.1, 763; 370/241

(56) References Cited

U.S. PATENT DOCUMENTS

| | | | | |
|---|---|---|---|---|
| 6,000,051 A | * | 12/1999 | Nadeau-Dostie et al. | ... 714/727 |
| 6,357,026 B1 | * | 3/2002 | Hoang et al. | ............... 714/727 |
| 6,586,921 B1 | * | 7/2003 | Sunter | ..................... 324/76.11 |
| 2002/0089335 A1 | * | 7/2002 | Williams | ..................... 324/533 |
| 2003/0080769 A1 | * | 5/2003 | Chen et al. | .................. 324/765 |
| 2003/0103462 A1 | * | 6/2003 | Smith | .......................... 370/241 |

OTHER PUBLICATIONS

Burlacu et al., 'Fault Compensation Control Method for Interconnected Voltage–Type Power Converters', Jul. 1997, IEEE Article, pp. 561–566.*

Pendurkar et al., Switching Activity Generation with Automated BIST Synthesis for Performance Testing of Interconects, Sep. 2001, IEEE Article, vol.:20, No: 9, pp. 1143–1158.*

* cited by examiner

*Primary Examiner*—Marc S. Hoff
*Assistant Examiner*—Elias Desta
(74) *Attorney, Agent, or Firm*—Blakely, Sokoloff, Taylor & Zafman LLP

(57) ABSTRACT

A method and apparatus for Interconnect Built-In Self-Test (IBIST) Based System Management Performance Tuning provides for measuring operating conditions of an interconnect, which is between a first device and a second device in a post-production system, at operating speed with a set of one or more test data and a first set of one or more operating parameters. Results of the measuring are stored and operating conditions of the interconnect with the set of test data and a second set of operating parameters are measured. The method and apparatus further provides for selecting either the first or second set of operating parameters based on the measuring of operating conditions to optimize operation of the post-production system.

32 Claims, 12 Drawing Sheets

METHOD AND APPARATUS FOR INTERCONNECT BUILT-IN SELF TEST BASED SYSTEM MANAGEMENT PERFORMANCE TUNING

BACKGROUND

1. Technical Field

The invention relates to the field of system management. More specifically, the invention relates to failure monitoring for system management.

2. Description of the Related Art

Certain computer systems, particularly servers and high-end workstations, include a platform management subsystem that monitors the computer system and indicates when the computer system is operating outside of a desired range. A conventional platform management subsystem includes a microcontroller that compares a sensors measurement to an associated threshold. If the sensor measurement is beyond an operating range defined by the associated threshold, then the event is logged. The logged event is then used by the platform management subsystem to determine if the computer system is operating abnormally. If the platform management subsystem determines that the computer system is operating abnormally, corrective action can be taken.

Although, platform management subsystems monitor certain operational aspects of a computer system, conventional platform management subsystems do not have access to test information related to interconnects between processor components and chipset components at operating speed.

Test information relating to interconnect operating conditions are not used beyond the manufacturing phase of a computer system (i.e., test information relating to interconnects is not used in post-production systems).

BRIEF DESCRIPTION OF THE DRAWINGS

The invention may best be understood by referring to the following description and accompanying drawings that are used to illustrate embodiments of the invention. In the drawings.

DETAILED DESCRIPTION OF THE DRAWINGS

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

Overview

Methods and apparatus for interconnect built-in self test based system management tuning and failure monitoring are described. A method and apparatus for interconnect built-in self-test based system management failure monitoring provides for failure detection and failure prediction based on measurements of interconnect operating conditions in a post-production system. A method and apparatus for interconnect built-in self test based system management performance tuning provides for tuning a post-production system for optimal performance based on interconnect operating condition measurements.

The results of failure monitoring based interconnect built-in self-test (IBIST) enable failure detection and failure prediction in a post-production system. Measurements of interconnect operating conditions and tracking measurements of interconnect operating conditions at operating speed of the interconnect over time enable detection of interconnect failures and/or prediction of interconnect failures (i.e., detection of degradations in operating conditions of an interconnect). The results of failure monitoring based on IBIST enable a system to respond to failures and/or potential failures.

In addition, thresholds that are indicative of a failure or degradation can be determined with IBIST result. Alternatively, thresholds that are indicative of a failure or degradation can be modified in accordance with nominal operation of an interconnect.

System management performance tuning based on IBIST improves system reliability of a post-production system. Furthermore, IBIST based system management performance tuning can be utilized for failure prediction.

IBIST Based Failure Monitoring

Figure 1:
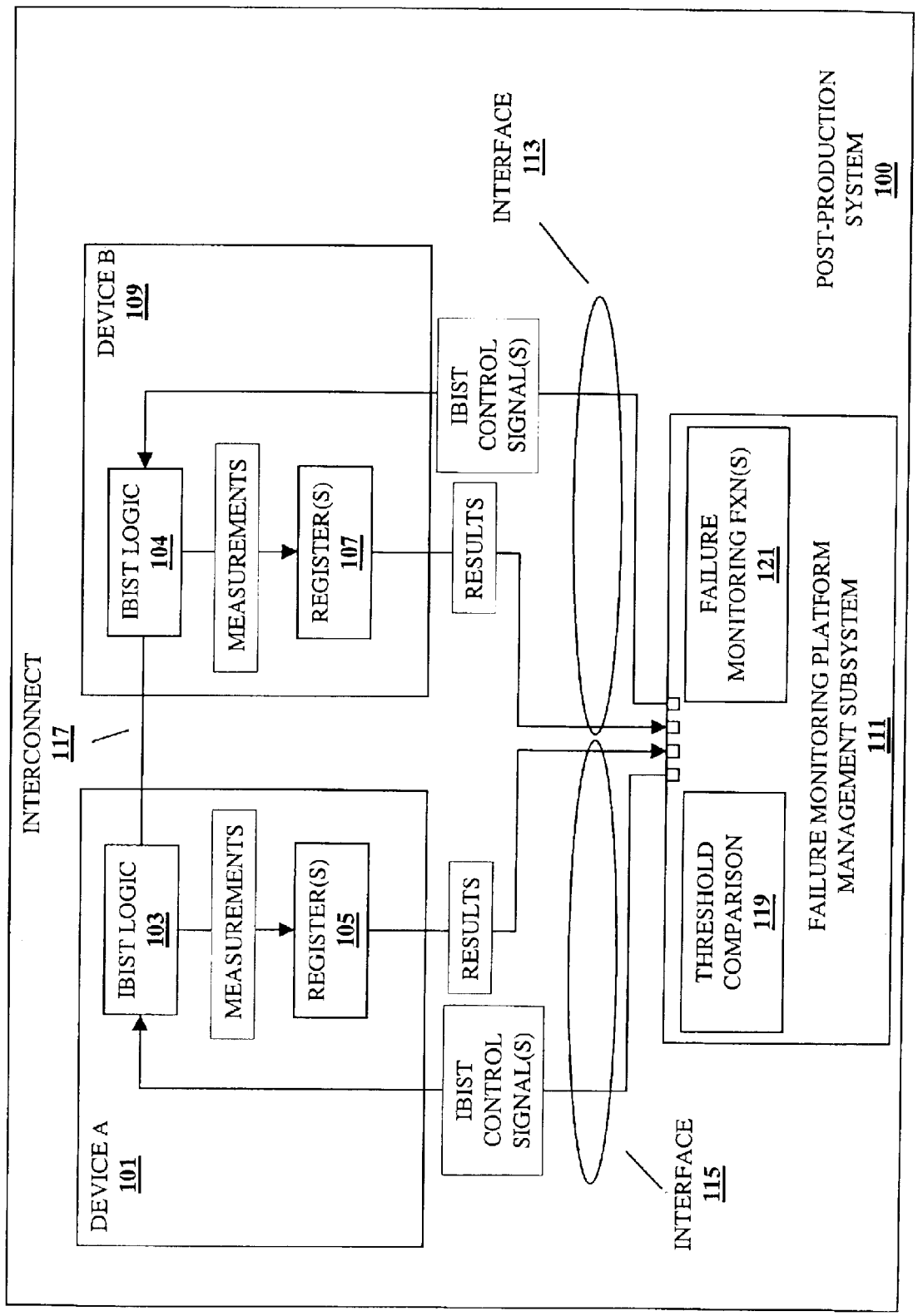
FIG. 1 is an exemplary block diagram of a post-production system with IBIST based failure monitoring according to one embodiment of the invention.

FIG. 1 is an exemplary block diagram of a post-production system with IBIST based failure monitoring according to one embodiment of the invention. In FIG. 1, a post-production system (e.g., a server or workstation in a live environment), includes a device A 101, a device B 109, and a platform management subsystem 111. A device may be a chipset component, a processor component, etc. The device A 101 includes IBIST logic 103 and a register(s) 105. Similarly, the device 109 includes IBIST logic 104 and a register(s) 107. IBIST logic may be firmware, software, etc. An interconnect 117 (e.g., a line, pad, pin, etc.) connects the device A 101 and the device B 109.

The platform management subsystem 111 (e.g., firmware, software, a microcontroller, etc.) includes a threshold comparison module 119 and a failure monitoring function(s) module 121.

An interface 115 couples the platform management subsystem 111 to the device A 101. An interface 113 (e.g., SMBus, I2C, etc.) couples the platform management subsystem 111 to the device B 109. The interface 113 is a bus used for inter-chip communications. In one embodiment of the invention, the bus is a 2-wire multi-master serial bus. While in one embodiment of the invention the interfaces 113 and 115 are physically separate, the interfaces 113 and 115 are a single physical interface in alternative embodiments of the invention.

The platform management subsystem 111 sends an IBIST control signal(s) to the IBIST logic 103 via the interface 115. Alternatively, or in addition, the platform management subsystem 111 sends a control signal(s) to the IBIST logic 104 via the interface 113. The IBIST logic 103 executes a built-in self-test of the interconnect 117 with respect to the device A 101. The IBIST logic 103 measures operating conditions of the interconnect 117 and stores the measurements, or results, in the register(s) 105. The platform management subsystem 111 retrieves the results from the register(s) 115. The threshold comparison module 119 analyzes the results against thresholds for failure monitoring purposes. The threshold comparison module 119 detects a failure and/or predicts a failure based on the retrieved results and threshold values in the threshold comparison module 119. In one embodiment of the invention, the threshold values are static. In another embodiment of the invention, the threshold values are configurable. If a failure is detected or predicted, then the failure monitoring function module 121 acts upon the detection or prediction. The failure monitoring function module 121 generates an alert, logs the detection or prediction, generates a status report, updates a status report, transmits a status report, and/or disables the device. Various embodiments of the invention initiate these actions differently (e.g., automatic initiation, manual initiation, remote initiation, etc.).

If a control signal(s) is sent to the IBIST logic 104 from the platform management subsystem 111, then the IBIST logic 104 measures operating conditions of the interconnect 117 and stores the measurements, or results, in the register(s) 107. These results are retrieved by the platform management subsystem 111 and analyzed and acted upon as with the results retrieved from the register(s) 105.

Figure 2:
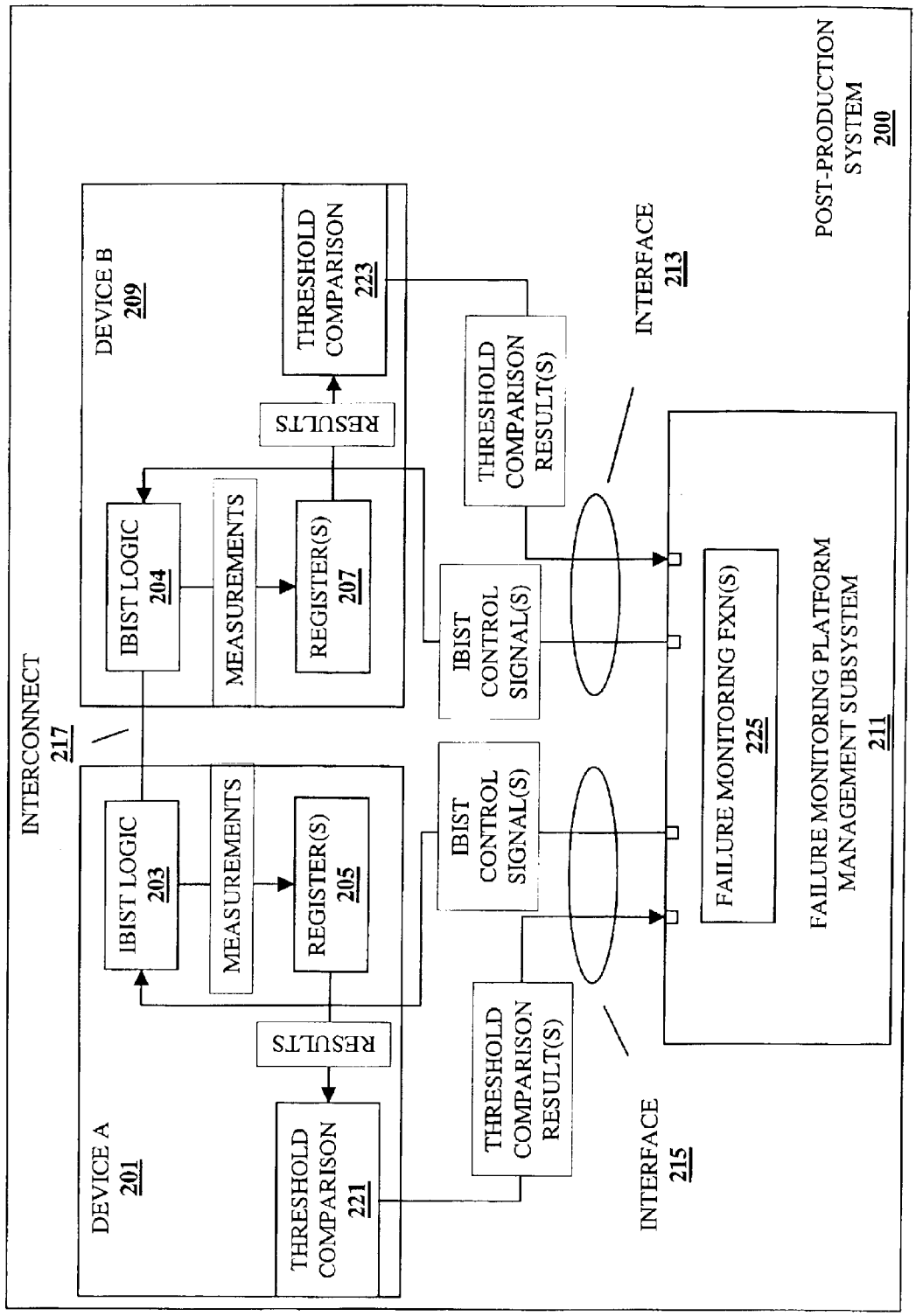
FIG. 2 is an exemplary diagram of a post-production system with devices having built-in threshold comparison modules according to one embodiment of the invention.

FIG. 2 is an exemplary diagram of a post-production system with devices having built-in threshold comparison modules according to one embodiment of the invention. In FIG. 2, a post-production system 200 includes a device A 201, a device B 209, and a platform management subsystem 211.

The device A 201 includes IBIST logic 203, a register(s) 205, and a threshold comparison module 221. The device B 209 includes IBIST logic 204, a register(s) 207, and a threshold comparison module 223. An interconnect 217 connects the device A 201 to the device B 209.

The platform management subsystem 211 includes a failure monitoring function module 225, similar to the failure monitoring function(s) module 121 of FIG. 1. The platform management subsystem 211 sends a control signal(s) (e.g., an instruction, activates a pin, etc.) to the IBIST logic 203 and/or the IBIST logic 204. Focusing on the IBIST logic 203, the IBIST logic 203 executes IBIST and measures operating conditions of the interconnect 217. The IBIST logic 203 stores the measurements in the register(s) 205. The threshold comparison module 221 retrieves these results to compare them against failure monitoring thresholds. The threshold comparison module 221 detects failure or predicts failure of the interconnect 217 based on the comparison of the IBIST results. The threshold comparison module 221 sends its threshold comparison result(s) to the platform management subsystem 211. The failure monitoring function(s) module 225 performs actions in accordance with the threshold comparison result(s) received from the threshold comparison module 221.

Although FIGS. 1 and 2 describe IBIST results as being stored in registers, in alternative embodiments of the invention IBIST results are indicated with a pin signal. Similarly, the threshold comparison results may be indicated with a pin signal.

Basing failure monitoring on IBIST results, or measurements, avoids special test hardware, software, and/or techniques typically required to access IBIST based failure information in a post-production system.

IBIST Based Failure Detection

Figure 3:
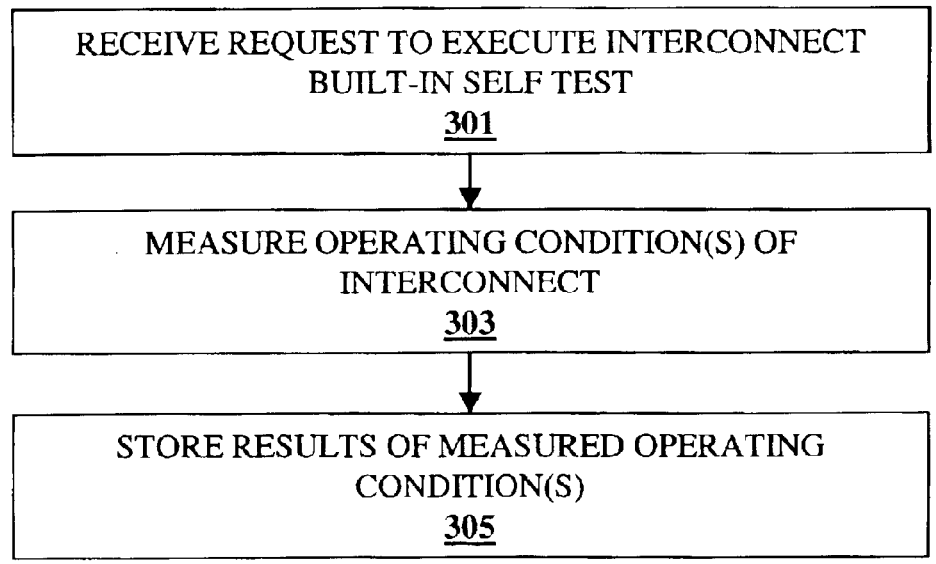
FIG. 3 is a flowchart for IBIST execution according to one embodiment of the invention.

FIG. 3 is a flowchart for IBIST execution according to one embodiment of the invention. At block 301, a device receives a request to execute IBIST. At block 303, operating condition(s) (e.g., data error rates, relative and absolute voltage, current, power, timing, voltage, jitter, etc.) of an interconnect are measured. At block 305, result(s) of measuring operating conditions are stored.

Figure 4:
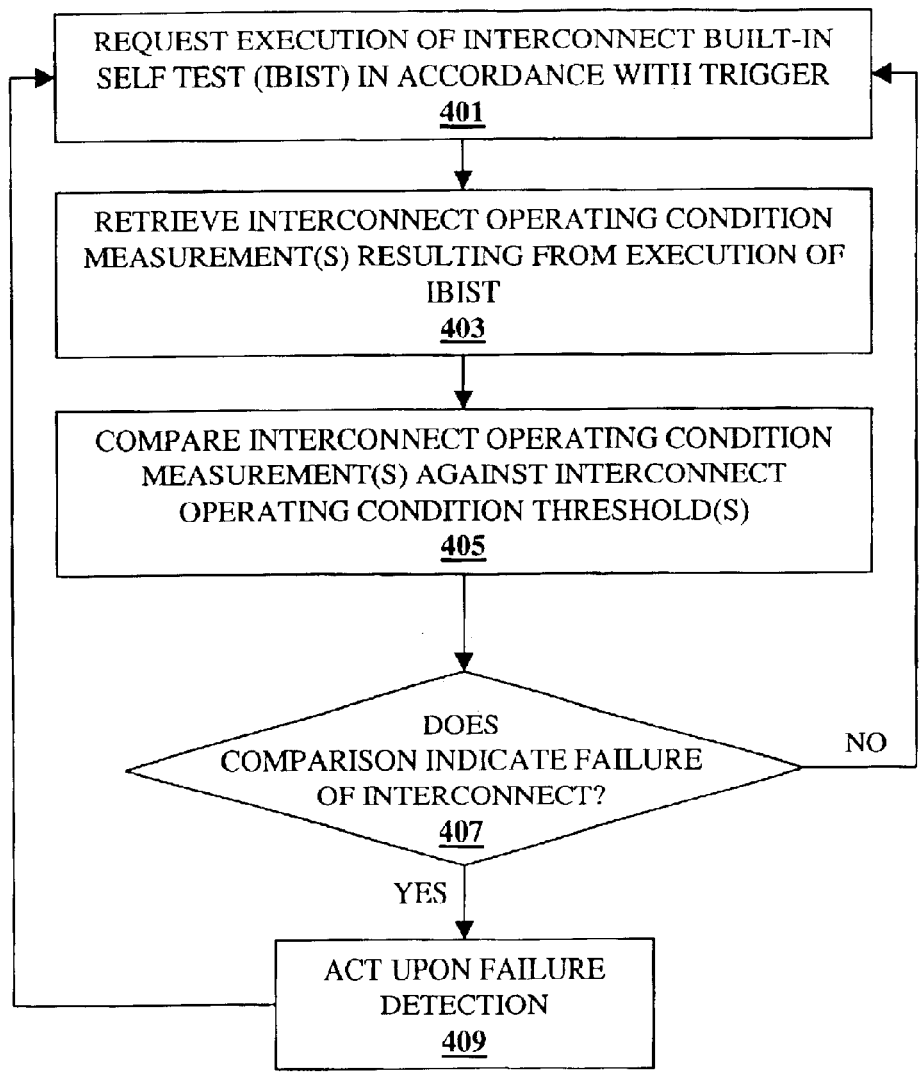
FIG. 4 is a flowchart for a platform management subsystem to analyze IBIST results according to one embodiment of the invention.

FIG. 4 is a flowchart for a platform management subsystem to analyze IBIST results according to one embodiment of the invention. At block 401, execution of IBIST is requested in accordance with a trigger (e.g., manual trigger, scheduled trigger, operating system phases, event triggers, etc.). At block 403, the interconnect operating condition measurement(s) resulting from IBIST execution are retrieved. At block 405, interconnect operating condition measurement(s) are compared against an interconnect operating condition threshold(s). At block 407, it is determined if the comparison indicates failure of the interconnect. The interconnect fails if the results of the IBIST execution go beyond the interconnect operating condition threshold(s). If the comparison indicates failure, then control flows to block 409. If the comparison does not indicate a failure, then control flows back to block 401.

At block 409, the failure detection is acted upon. From block 409, control flows back to block 401.

IBIST Based Failure Prediction

Figure 5:
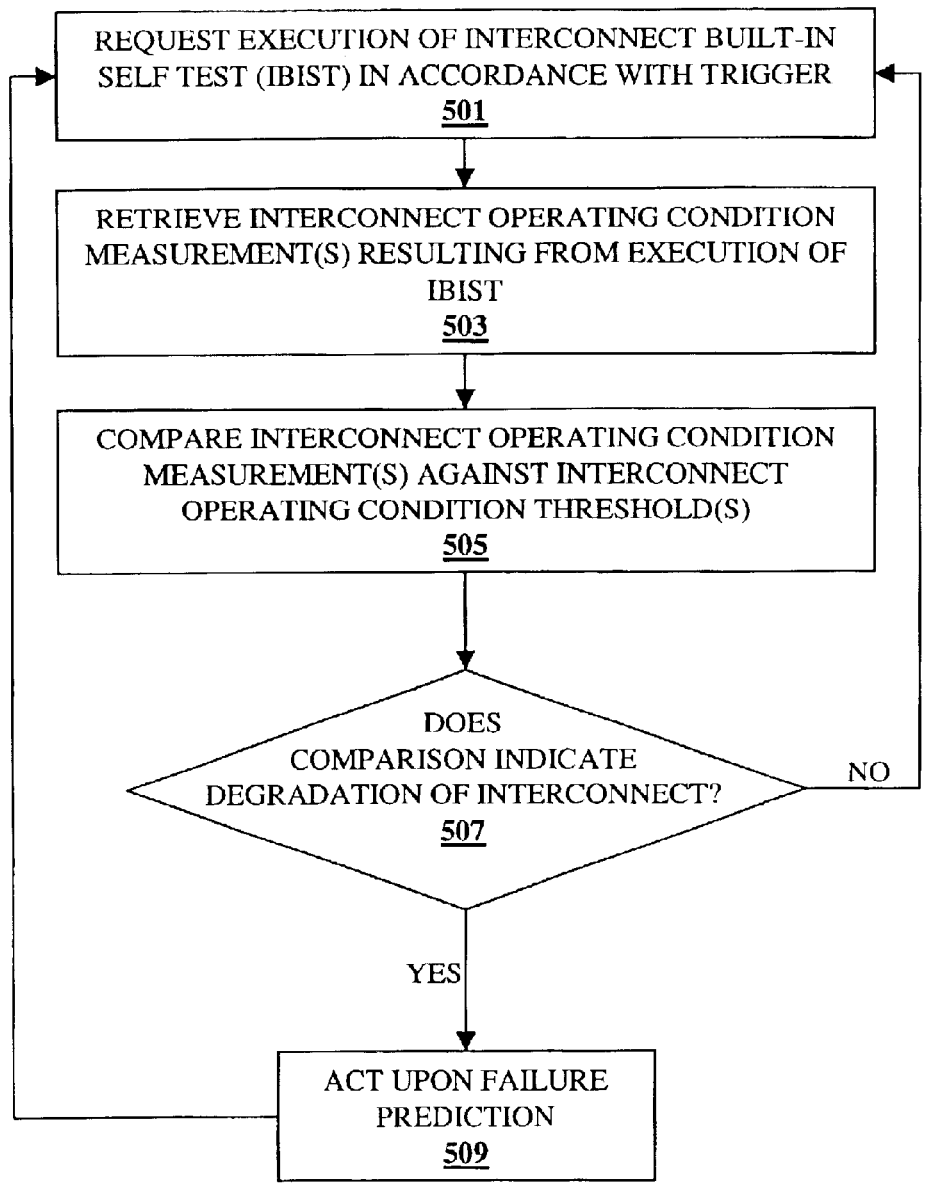
FIG. 5 is a flowchart for IBIST based failure prediction according to one embodiment of the invention.

FIG. 5 is a flowchart for IBIST based failure prediction according to one embodiment of the invention. At block 501, execution of IBIST is requested in accordance with a trigger (e.g., manual trigger, scheduled trigger, operating system phases, event triggers, etc.). At block 503, the interconnect operating condition measurement(s) resulting from IBIST execution are retrieved. At block 505, interconnect operating condition measurement(s) are compared against an interconnect operating condition threshold(s). At block 507, it is determined if the comparison indicates degradation of the interconnect. The interconnect is degrading if the results of the IBIST execution indicate that the interconnect is operating in an acceptable condition, but has degraded since a last IBIST execution (e.g., since manufacturing). Failure prediction is based on IBIST results being quantitatively different than "good" or "nominal" conditions for the given interconnect, but is also quantitatively different than "bad" conditions. While in one embodiment of the invention, degradation is determined by comparing current IBIST results with a single set of previous IBIST results, in alternative embodiments of the invention degradation is determined from a trend indicated by a series of past IBIST results accumulated over time. For example, it may be determined that an interconnect is degrading is the last X results were successively worse. In another example, determination of on interconnect degrading may be based on 4 of a first 5 IBIST results being more than Z% from nominal while only 1 out of a second 5 results (which precede the first 5 in time) was more than Z% from nominal. If the comparison indicates degradation, then control flows to block 509. If the comparison does not indicate degradation, then control flows back to block 501.

At block 509, the failure prediction is acted upon. From block 509, control flows back to block 501.

Figure 6:
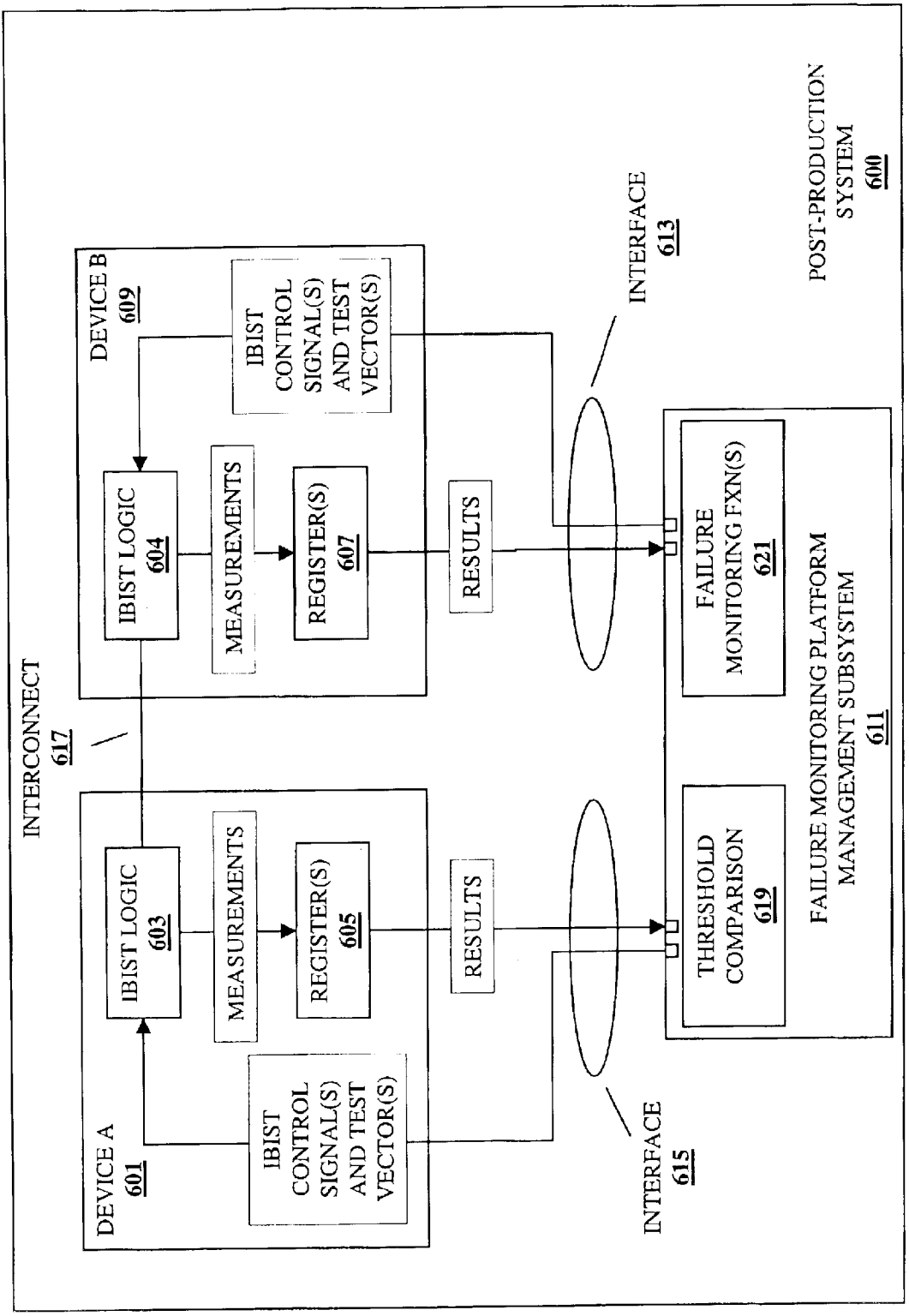
FIG. 6 is an exemplary diagram of a post-production system driving test vectors according to one embodiment of the invention.

FIG. 6 is an exemplary diagram of a post-production system driving test vectors according to one embodiment of the invention. The post-production system illustrated in FIG. 6 is similar to the post-production system illustrated in FIG. 1. In FIG. 6, a post-production system (e.g., a server or workstation in a live environment) includes a device A 601, a device B 609, and a platform management subsystem 611. A device may be a chipset component, a processor component, etc. The device A 601 includes IBIST logic 603 and a register(s) 605. Similarly, the device 609 includes IBIST logic 604 and a register(s) 607. IBIST logic may be firmware, software, etc. An interconnect 617 (e.g., a line, pad, pin, etc.) connects the device A 601 and the device B 609.

The platform management subsystem 611 (e.g., firmware, software, a microcontroller, etc.) includes a threshold comparison module 619 and a failure monitoring function(s) module 621.

An interface 615 couples the platform management subsystem 611 to the device A 601. An interface 613 (e.g., SMBus) couples the platform management subsystem 611 to the device B 609. While in one embodiment of the invention the interfaces 613 and 615 are physically separate, the interfaces 613 and 615 are a single physical interface in alternative embodiments of the invention.

The platform management subsystem 611 sends an IBIST control signal(s) and a test vector(s) to the IBIST logic 603 via the interface 615. Test vectors represent test data used to drive the interface during the IBIST execution. A test vector may change operating voltages, timing, current, impedance, characteristics of the interface, and/or apply such changes as a test sequence. The IBIST logic 603 executes a built-in self-test of the interconnect 617 with respect to the device A 601 under the conditions created by the test vector(s). The IBIST logic 603 measures operating conditions of the interconnect 617 and stores the measurements, or results, in the register(s) 605. The platform management subsystem 611 retrieves the results from the register(s) 605. The threshold comparison module 619 analyzes the results against thresholds for failure monitoring purposes. The threshold comparison module 619 detects a failure and/or predicts a failure based on the retrieved results and threshold values in the threshold comparison module 619. If a failure is detected or predicted, then the failure monitoring function module 621 acts upon the detection or prediction.

Figure 7:
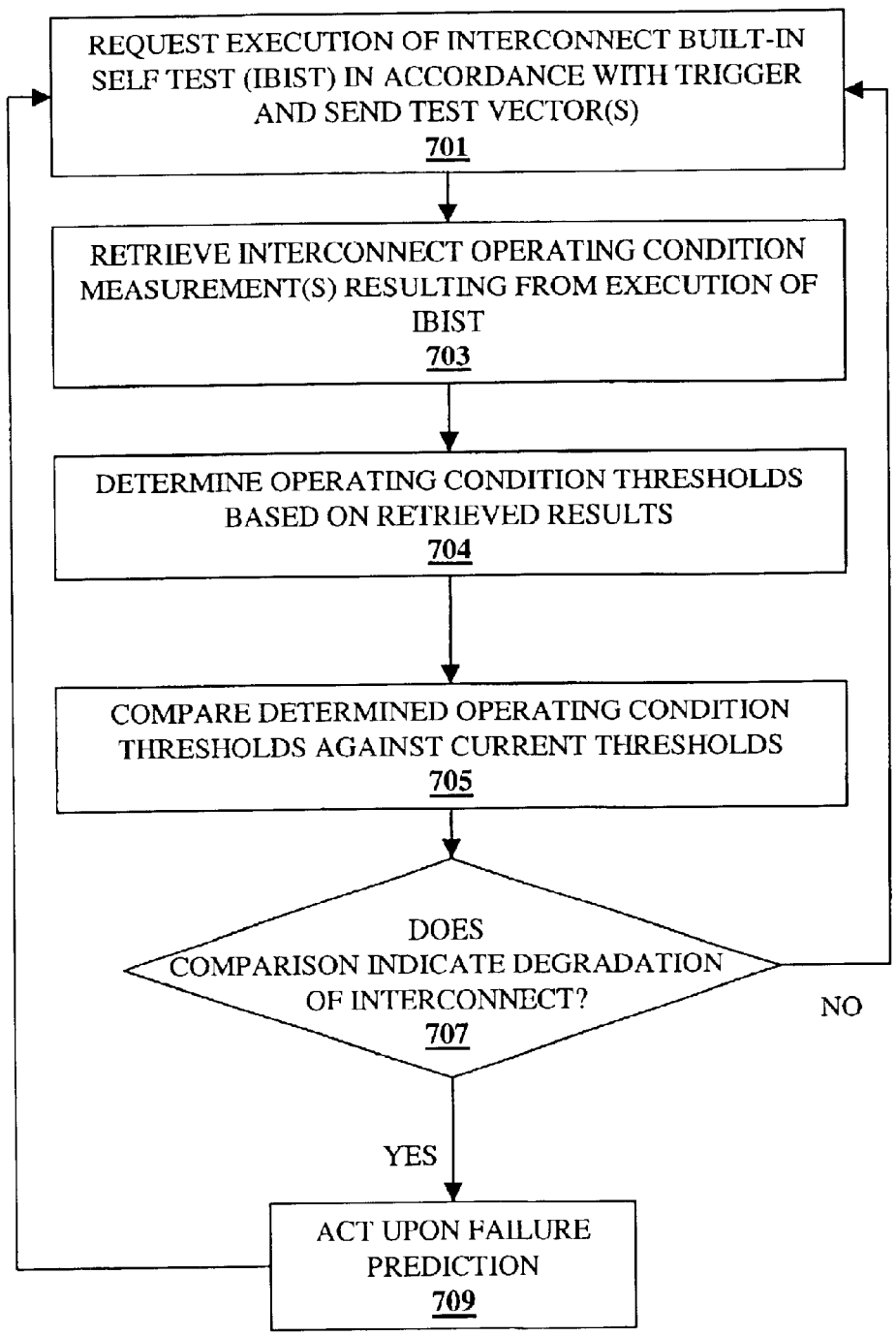
FIG. 7 is a flowchart for determining threshold changes for failure prediction according to one embodiment of the invention.

FIG. 7 is a flowchart for determining threshold changes for failure prediction according to one embodiment of the invention. At block 701, execution of IBIST in accordance with a trigger is requested and a test vector(s) is sent. At block 703, the interconnect operating condition measurement(s) resulting from IBIST execution is retrieved. At block 704, operating condition thresholds based on the retrieved results are determined. At block 705, the determined operating condition thresholds are compared against current thresholds. At block 707, it is determined if the comparison indicates degradation in operation of the interconnect. If the comparison indicates degradation of the operation of the interconnect, then control flows to block 709. If the comparison does not indicate degradation of the interconnect, then control flows to block 701.

At block 709, the failure prediction is acted upon. From block 709, control flows to block 701.

It is shown in FIG. 7 that tuning parameters can be used as the basis for failure prediction. A new set of tuning parameters (the test vector(s)) are selected until degradation or failure occurs in the interconnect. As the threshold changes, failures can be predicted based on current tuning parameters that caused the interconnect to reach degradation or failure against past tuning parameters.

Modifying Baselines with IBIST Results

Figure 8:
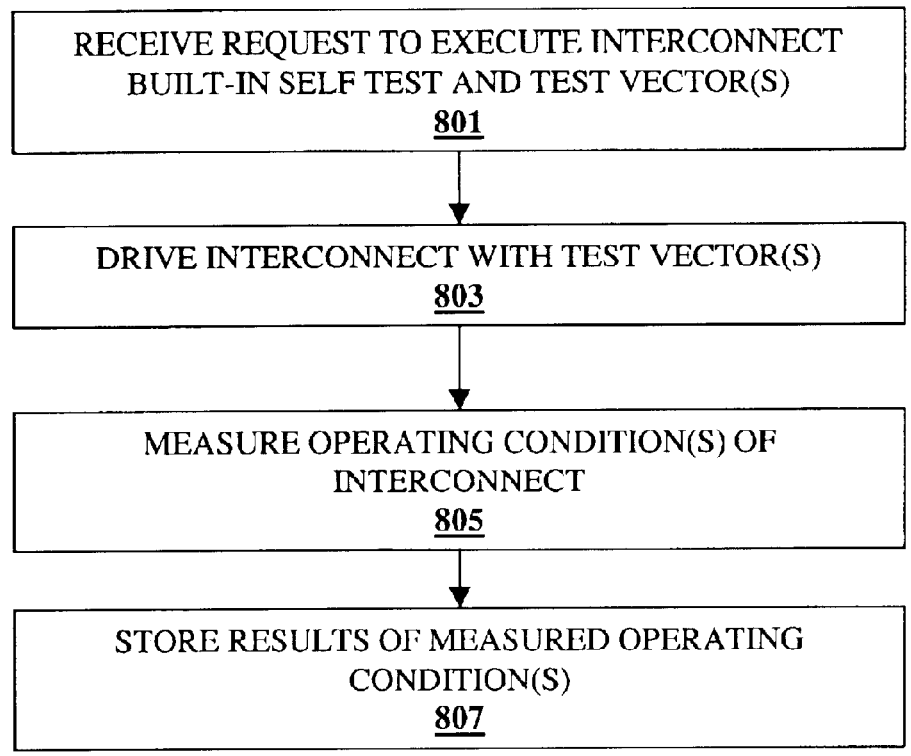
FIG. 8 is a flowchart for determining operating conditions for baseline adjustment according to one embodiment of the invention.

FIG. 8 is a flowchart for determining operating conditions for baseline adjustment according to one embodiment of the invention. At block 801, a request to execute IBIST and a test vector(s) are received. At block 803, drive interconnect with the test vector(s). At block 805, the operating condition(s) of the interconnect is measured. At block 807, results of the measured operating condition(s) are stored.

Figure 9:
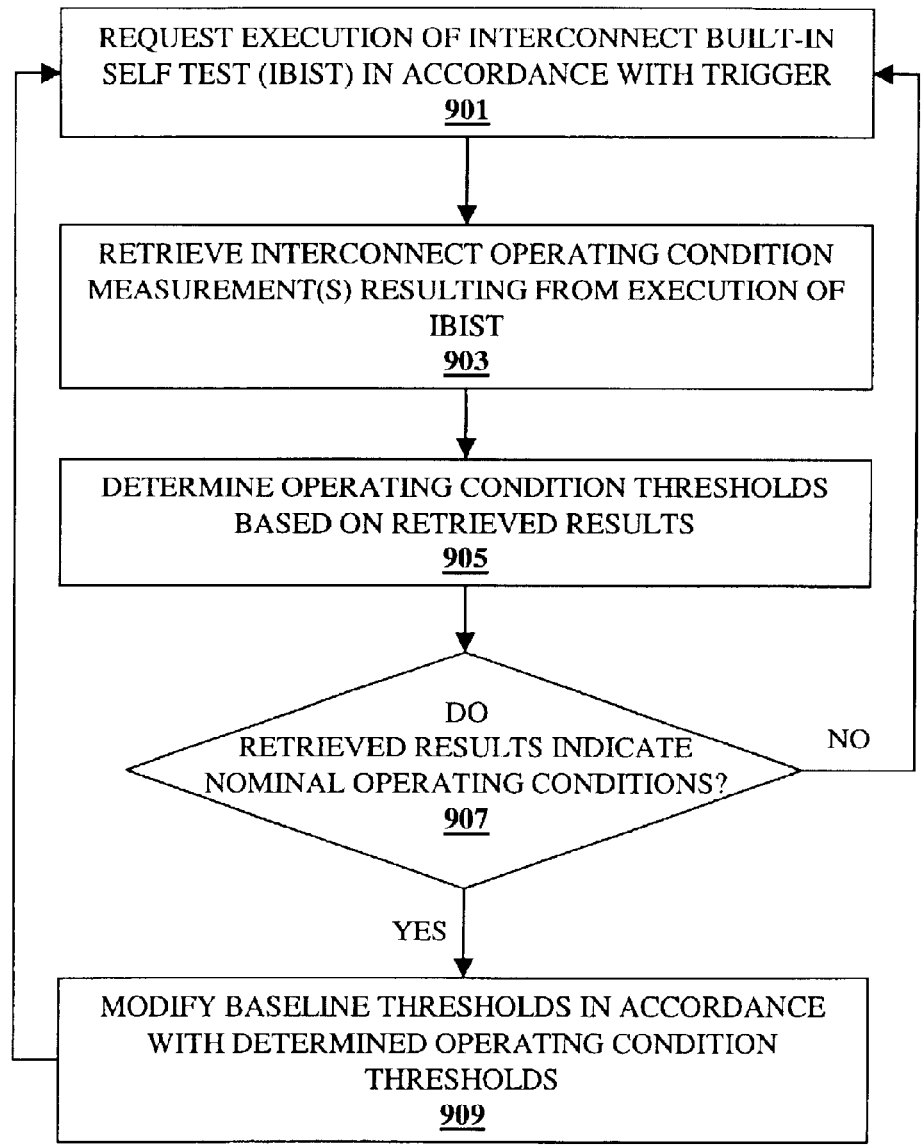
FIG. 9 is a flowchart for modifying a baseline based on IBIST results according to one embodiment of the invention.

FIG. 9 is a flowchart for modifying a baseline based on IBIST results according to one embodiment of the invention. At block 901, IBIST execution in accordance with a trigger is requested. At block 903, interconnect operating condition measurement(s) resulting from IBIST execution are retrieved. At block 905, an operating condition threshold(s) based on the retrieved results are determined. At block 907, it is determined if the retrieved results indicate nominal operating conditions. If the retrieved results indicate nominal operating conditions, then control flows to block 909. If the retrieved results do not indicate nominal operating conditions, then control flows to block 901.

At block 909, the baseline thresholds are modified in accordance with determined operating condition thresholds. From block 909, control flows to block 901.

Adjusting thresholds enables the thresholds to be moved closer to nominal operation, thus providing for earlier failure detection or prediction. As the tuning parameters become more extreme or further from ideal tuning parameters in order to reach nominal operation, failure or degradation becomes more eminent.

IBIST Based Performance Tuning

Figure 10:
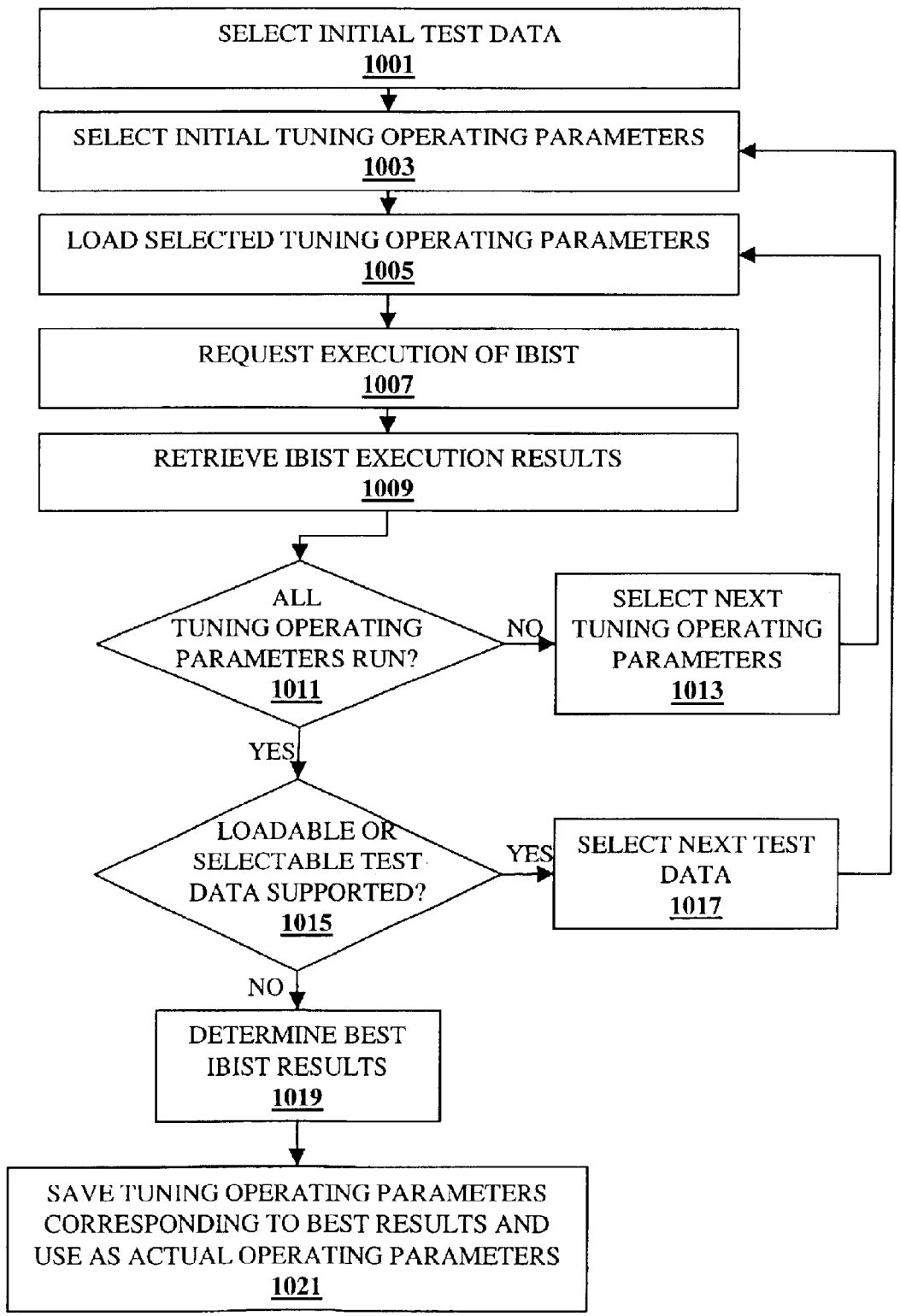
FIG. 10 is a flowchart for tuning operating parameters based on IBIST results according to one embodiment of the invention.

FIG. 10 is a flowchart for tuning operating parameters based on IBIST results according to one embodiment of the invention. At block 1001, initial test data is selected. At block 1003, initial tuning operating parameters are selected. At block 1005, selected tuning operating parameters are loaded. At block 1007, execution of IBIST is requested. At block 1009, IBIST execution results are retrieved. At block 1011, it is determined if all tuning operating parameters have been run. If all tuning operating parameters have been run, then control flows to block 1015. If all tuning operating parameters have not been run, then control flows to block 1013.

At block 1013, the next tuning operating parameters are selected. From block 1013, control flows to block 1005.

At block 1015, it is determined if loadable or selectable test data is supported. If loadable or selectable test data is supported, then control flows to block 1017. If loadable or selectable test data is not supported, then control flows to block 1019.

At block 1017, the next test data is selected. Control flows from block 1017 to block 1003.

At block 1019, the best IBIST results are determined. At block 1021, the tuning operating parameters that correspond to the best results are saved and used as actual operating parameters.

In certain embodiments of the invention, the test data and the tuning operating parameters overlap. In other embodiments of the invention, the test data and the tuning operating parameters are the same. IBIST based tuning improves system reliability by running a system in an optimized state where the nominal operating range is farther away from operating limits than the system would be without IBIST based tuning. IBIST based tuning also optimized power consumption so that components run cooler, hence increasing longevity of the components.

Figure 11:
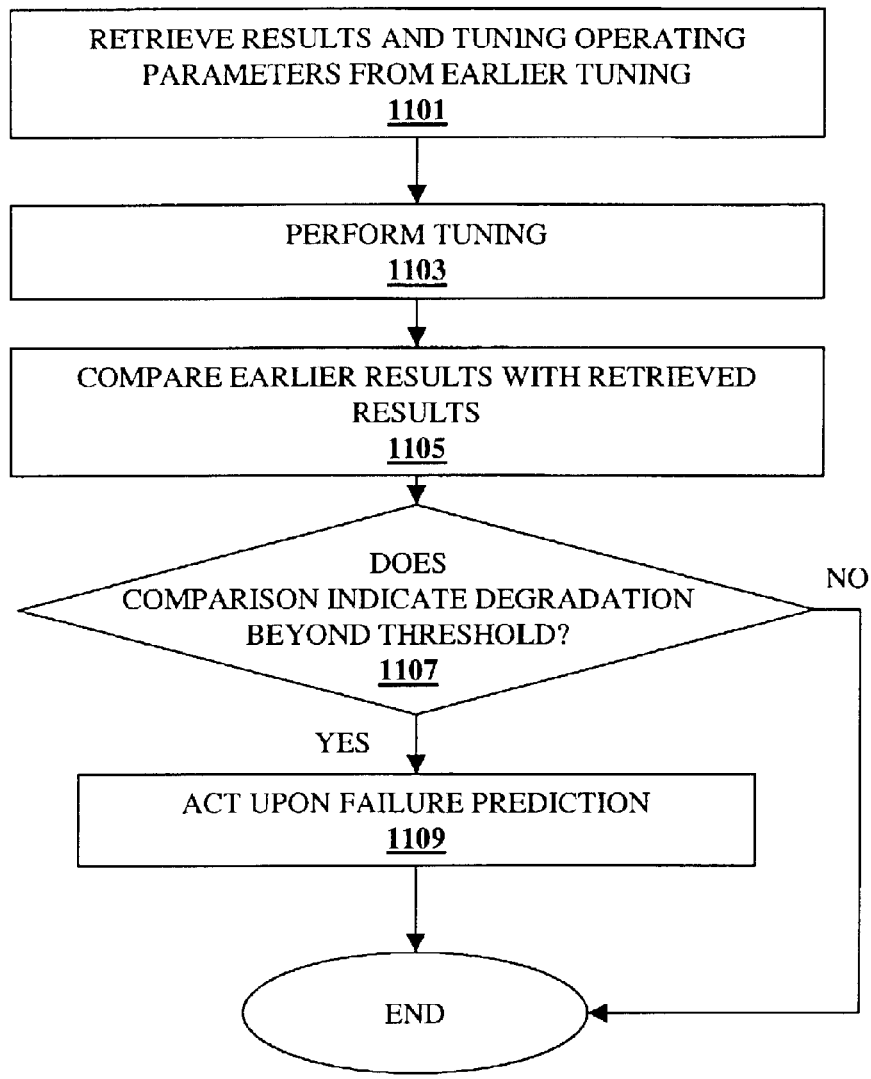
FIG. 11 is a flowchart for failure prediction with IBIST based tuning according to one embodiment of the invention.

FIG. 11 is a flowchart for failure prediction with IBIST based tuning according to one embodiment of the invention. At block 1101, IBIST results and tuning operating parameters from earlier tuning are retrieved. At block 1103, tuning is performed. At block 1105, earlier IBIST results are compared against the retrieved results. At block 1107, it is determined if the comparison indicates degradation beyond a threshold. If the comparison indicates degradation beyond the threshold, then control flows to block 1109. If the comparison does not indicate degradation beyond the threshold, then the process ends. At block 1109, the failure prediction is acted upon.

Figure 12:
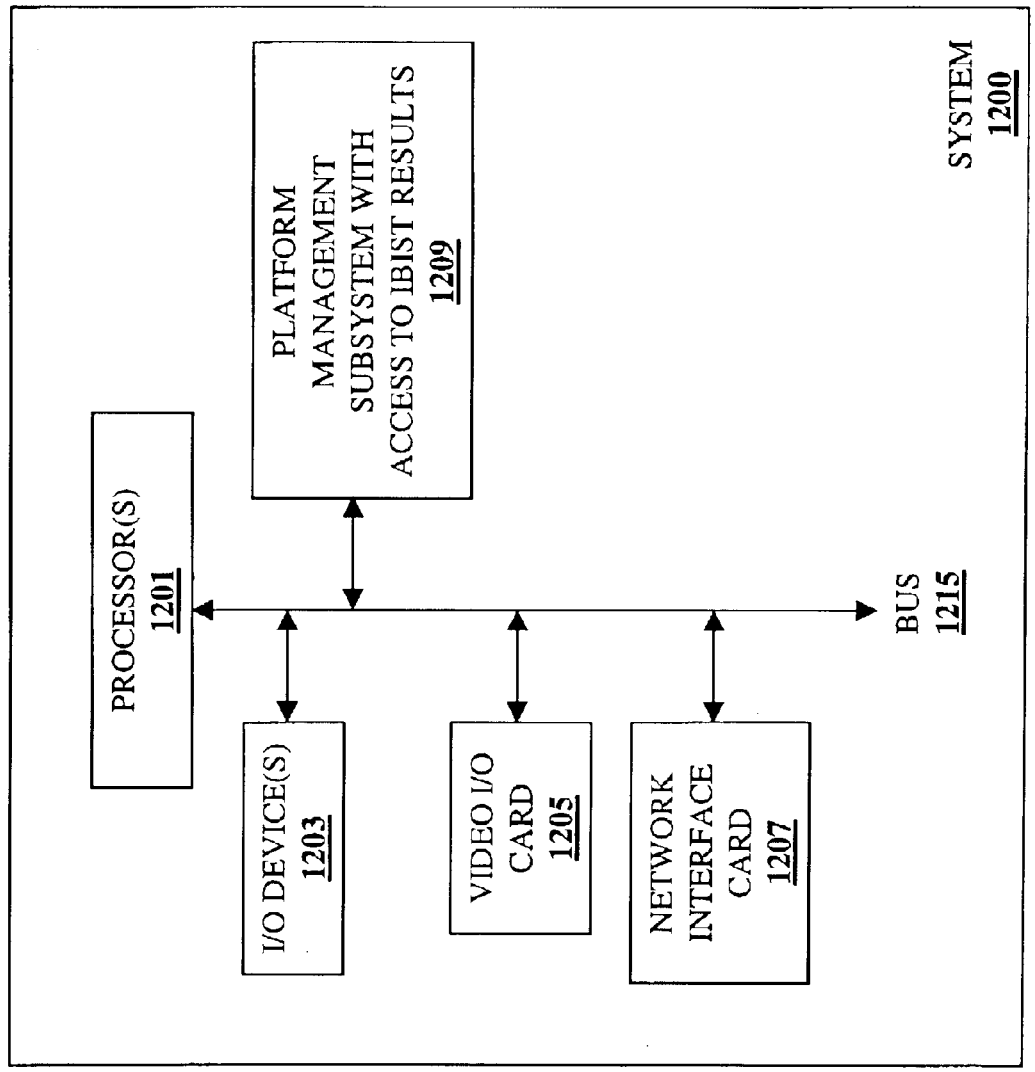
FIG. 12 is a block diagram illustrating one embodiment of a computer system according to one embodiment of the invention.

FIG. 12 is a block diagram illustrating one embodiment of a computer system according to one embodiment of the invention. The computer system 1200 comprises a processor(s) 1201, a bus 1215, I/O devices 1203 (e.g., keyboard, mouse), and a network interface card 1207 (e.g., an Ethernet card, an ATM card, a wireless network card, etc.). The processor(s) 1201, the I/O devices 1203, and the network interface card 1207 are coupled with the bus 1215. The processor(s) 1201 represents a central processing unit of any type of architecture, such as CISC, RISC, VLIW, or hybrid architecture. Furthermore, the processor(s) 1201 could be implemented on one or more chips. The bus 1215 represents one or more buses (e.g., AGP, PCI, ISA, X-Bus, VESA, HyperTransport, etc.) and bridges. While this embodiment is described in relation to a single processor computer system, the described invention could be implemented in a multi-processor computer system.

In addition, platform management subsystem 1209 is coupled with the bus 615. The platform management subsystem 1209 has access to IBIST results for interconnects between components of the processor 1201 and chipset components of the system 1200.

The Figures above include machine-readable medium. For the purpose of this specification, the term "machine-readable medium" shall be taken to include any mechanism that provides (i.e., stores and/or transmits) information in a form readable by a machine (e.g., a computer). A set of instructions (i.e., software) embodying any one, or all, of the methodologies described herein is stored on the machine-readable medium. Software can reside, completely or at least partially, within this machine-readable medium and/or within the processor and/or ASICs. For example, a machine-readable medium includes read only memory ("ROM"), random access memory ("RAM") (e.g., DDR SDRAM, EDO DRAM, SDRAM, BEDO DRAM, etc.) magnetic disk storage media, optical storage media, flash memory devices, electrical, optical, acoustical, or other form of propagated signals (e.g., carrier waves, infrared signals, digital signals, etc.), etc.

In addition to other devices, one or more of a video card 1205 may optionally be coupled to the bus 1215. The video card 1205 represents one or more devices for digitizing images, capturing images, capturing video, transmitting video, etc.

While the invention has been described in terms of several embodiments, those skilled in the art will recognize that the invention is not limited to the embodiments described. The method and apparatus of the invention may be practiced with modification and alteration within the spirit and scope of the appended claims. The description is thus to be regarded as illustrative instead of limiting on the invention.

What is claimed is:

1. A method comprising:

measuring operating conditions of an interconnect, between a first device and a second device in a system, with a set of one or more test data and a first set of one or more operating parameters;

measuring operating conditions of the interconnect with the set of test data and a second set of one or more operating parameters; and selecting either the first or second set of operating parameters based on the measuring of operating conditions to optimize operation of the system.

2. The method of claim 1 wherein the first device is a chipset component and the second device is a processor component.

3. The method of claim 1 wherein the generating results is via a pin.

4. The method of claim 1 further comprising basing failure prediction on differences between the first set of operating parameters and the second set of operating parameters.

5. The method of claim 4 further comprising generating an alert, generating a status report, and/or logging a predicted failure.

6. A method comprising:

driving an interconnect that connects a first device and a second device of a system with a set of test data and a set of tuning operating parameters;

measuring operating conditions of the interconnect driven by the set of test data and the set of tuning operating parameters;

modifying the set of tuning operating parameters at least once;

measuring operating conditions of the interconnect each time the set of operating parameters is modified;

determining an optimal measured operating condition from the plurality of measured operating conditions; and selecting the set of tuning operating parameters that resulted in the optimal measured operating condition to be actual operating parameters for the system.

7. The method of claim 6 wherein the first device is a chipset component and the second device is a processor component.

8. The method of claim 6 wherein the measuring is at test speed.

9. The method of claim 6 further comprising performing failure prediction based on changes of the tuning operating parameters over time.

10. An apparatus comprising:

an interconnection that connects a first device to a second device;

the first device having, a first interconnection operating condition measurement logic to measure operating conditions of the interconnection with respect to the first device with a first set of test data and a first set of tuning operating parameters, a first set of one or more non-volatile memory to store results generated by the first interconnection operating condition measurement logic;

the second device having, a second interconnection operating condition measurement logic to measure operating conditions of the interconnection with respect to the second device with a second set of test data and a second set of tuning operating parameters, a second set of one or more non-volatile memory to store results generated by the second interconnection operating condition measurement logic; and a platform tuning management subsystem coupled with the first and second device, the platform management subsystem having a set of tuning operating parameters, and the platform tuning management subsystem to set actual operating parameters in accordance with tuning operating parameters that result in a best measured test operating condition.

11. The apparatus of claim 10 wherein the interconnect is a pin, pad, or line.

12. The apparatus of claim 10 wherein the first device is a chipset component and the second device is a processor component.

13. The apparatus of claim 10 wherein the platform management subsystem is an autonomous management microcontroller.

14. The apparatus of claim 10 wherein the platform management subsystem is a machine-readable medium having a set of instructions stored thereon to cause a processor to perform the failure monitoring.

15. The apparatus of claim 10 wherein the first and second interconnect operating condition measurement logics are firmware or software.

16. A post-production system comprising:

a board that includes a plurality of devices;

an interconnection that connects a first of the plurality of devices and a second of the plurality of devices of the board;

an interconnection operating measurement module to measure test operating conditions of the interconnection with a set of test data and a set of tuning operating parameters, which are modified at least once, each time the set of tuning operating parameters are modified;

an autonomous tuning system management controller coupled with the interconnection operating measurement module to send control signals and thresholds to the interconnection operating measurement module, to receive results from the interconnection operating measurement module, to modify a set of tuning operating parameters, and to use a set of tuning operating parameters that result in a best measured test operating conditions as actual operating parameters for the system; and a bus to couple the autonomous system management controller with the interconnection operating measurement module.

17. The system of claim 16 wherein the bus is a 2-wire multi-master serial bus.

18. The system of claim 16 wherein the interconnect is a pin, wire, or pad.

19. The system of claim 16 wherein the plurality of devices include a chipset component and a processor component.

20. The system of claim 16 wherein the interconnection operating measurement module is firmware or software.

21. A machine-readable medium that provides instructions, which when executed by a set of one or more processors, cause said set of processors to perform operations comprising:

measuring operating conditions of an interconnect, between a first device and a second device in a computer system, at operating speed with a set of one or more test data and a first set of one or more operating parameters;

storing results of the measuring;

measuring operating conditions of the interconnect with the set of test data and a second set of operating parameters; and selecting either the first or second set of operating parameters based on the measuring of operating conditions to optimize operation of the post-production system.

22. The machine-readable medium of claim 21 wherein the operating conditions are voltage, power, current, and/or jitter.

23. The machine-readable medium of claim 21 wherein the first device is a chipset component and the second device is a processor component.

24. The machine-readable medium of claim 21 wherein the generating results is via a pin.

25. The machine-readable medium of claim 21 further comprising basing failure prediction on differences between the first set of operating parameters and the second set of operating parameters.

26. The machine-readable medium of claim 25 further comprising generating an alert, generating a status report, and/or logging a predicted failure.

27. A method comprising:

determining condition thresholds of an interconnect in a system;

measuring operating conditions of the interconnect;

comparing the interconnect operating condition measurements against the interconnect operating condition thresholds; and executing steps based on the comparison to optimize system operation.

28. The method of claim 27, wherein the interconnect condition thresholds are determined statically.

29. The method of claim 27, wherein the interconnect condition thresholds are determined dynamically.

30. The method of claim 27, wherein the operating condition thresholds are based on the measured operating conditions of the interconnect.

31. The method of claim 27 wherein the measuring is at test speed.

32. The method of claim 1 wherein the measuring is at test speed.

* * * * *